United States Patent
Mahadeswaraswamy

(10) Patent No.: US 9,165,804 B2
(45) Date of Patent: Oct. 20, 2015

(54) METHODS OF COOLING PROCESS CHAMBER COMPONENTS

(75) Inventor: Chetan Mahadeswaraswamy, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 796 days.

(21) Appl. No.: 13/452,292

(22) Filed: Apr. 20, 2012

(65) Prior Publication Data

US 2012/0273162 A1 Nov. 1, 2012

Related U.S. Application Data

(60) Provisional application No. 61/480,560, filed on Apr. 29, 2011.

(51) Int. Cl.
| | |
|---|---|
| *H01L 23/34* | (2006.01) |
| *H01L 21/67* | (2006.01) |
| *H01J 37/32* | (2006.01) |
| *H01L 23/473* | (2006.01) |

(52) U.S. Cl.
CPC ....... *H01L 21/67109* (2013.01); *H01J 37/3244* (2013.01); *H01J 37/32522* (2013.01); *H01L 23/34* (2013.01); *H01L 23/473* (2013.01)

(58) Field of Classification Search
CPC . H01L 23/34; H01L 23/473; H01L 21/67098; H01L 21/67103; H01L 21/67109
See application file for complete search history.

(56) References Cited

U.S. PATENT DOCUMENTS

| | | | |
|---|---|---|---|
| 5,864,176 A * | 1/1999 | Babock et al. | 257/714 |
| 2010/0210041 A1* | 8/2010 | Chang et al. | 438/8 |
| 2012/0048467 A1 | 3/2012 | Mahadeswaraswamy et al. | |

* cited by examiner

*Primary Examiner* — Jonathan Bradford
(74) *Attorney, Agent, or Firm* — Moser Taboada; Alan Taboada

(57) ABSTRACT

Methods for cooling process chamber components are provided herein. In some embodiments, a method of cooling a process chamber component may include reducing a power provided to a heater disposed proximate a surface of the process chamber component to reduce an amount of heat provided to the component by the heater; providing a coolant to coolant channels disposed within the process chamber component using a pulsed flow having a duty cycle until the process chamber component reaches a temperature that is less than or equal to a predetermined magnitude above a temperature of the coolant; and after the process chamber component reaches the temperature less than or equal to the predetermined magnitude above a temperature of the coolant, reducing the duty cycle of the pulsed flow of the coolant to zero.

18 Claims, 4 Drawing Sheets

METHODS OF COOLING PROCESS CHAMBER COMPONENTS

CROSS-REFERENCE TO RELATED APPLICATIONS

This application claims benefit of U.S. provisional patent application Ser. No. 61/480,560, filed Apr. 29, 2011, which is herein incorporated by reference.

FIELD

Embodiments of the present invention generally relate to substrate processing equipment.

BACKGROUND

Process chambers utilized in substrate processing typically comprise a number of internal components that are repeatedly heated and cooled during and after processes are performed. In some instances, for example, when routine service or maintenance is needed after a process has been performed in a process chamber, the components are cooled to about room temperature.

In temperature controlled components, for example, such as process chamber showerheads having coolants channels, to cool the component from a typical operating temperature (e.g. about 90 degrees Celsius), a heat source that heats the component may be shut off and a coolant is flowed through the coolant channels to extract heat from the component. However, the inventors have observed when the component is cooled too rapidly, the component may incur damage. For example, when cooling a two piece showerhead having multiple parts (e.g. a body and faceplate) with different coefficients of thermal expansion coupled together via a bonding material, rapid cooling of the showerhead may unduly strain or stress the bonding material, causing the parts of the showerhead to de-bond.

To prevent such damage due to the rapid cooling, the coolant flow may be stopped or the coolant temperature may be manually increased in sequential steps to allow the component to cool slowly. However, cooling in such a manner is labor intensive and/or slow, leading to increased downtime of processing equipment and decreased efficiency of processing systems.

Accordingly, the inventor has provided improved methods of cooling process chamber components.

SUMMARY

Methods for cooling process chamber components are provided herein. In some embodiments, a method of cooling a process chamber component may include reducing a power provided to a heater disposed proximate a surface of the process chamber component to reduce an amount of heat provided to the component by the heater; providing a coolant to coolant channels disposed within the process chamber component using a pulsed flow having a duty cycle until the process chamber component reaches a temperature that is less than or equal to a predetermined magnitude above a temperature of the coolant; and after the process chamber component reaches the temperature less than or equal to the predetermined magnitude above a temperature of the coolant, reducing the duty cycle of the pulsed flow of the coolant to zero.

In some embodiments, a method of cooling a process chamber component having coolant channels and a heater disposed within the process chamber component may include flowing a coolant through the coolant channels to remove heat from the process chamber component; and reducing a power provided to the heater to reduce an amount of heat provided to the process chamber component by the heater by (a) providing a first heater temperature setpoint in accordance with a predetermined temperature rampdown schedule; (b) reducing a power provided to the heater until the heater reaches the first heater temperature setpoint; (c) providing a second heater temperature setpoint in accordance with a predetermined temperature rampdown schedule; (d) reducing the power provided to the heater until the heater reaches the second heater temperature setpoint; and (e) repeating (c)-(d) using sequentially lower heater temperature setpoints until the process chamber component reaches a temperature that is less than or equal to a predetermined magnitude above a temperature of the coolant.

In some embodiments, the inventive methods described herein may be embodied in a computer readable medium. The computer readable medium has instructions stored thereon that, when executed, cause a process chamber to perform a method of cooling a process chamber component in accordance with any of the methods described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
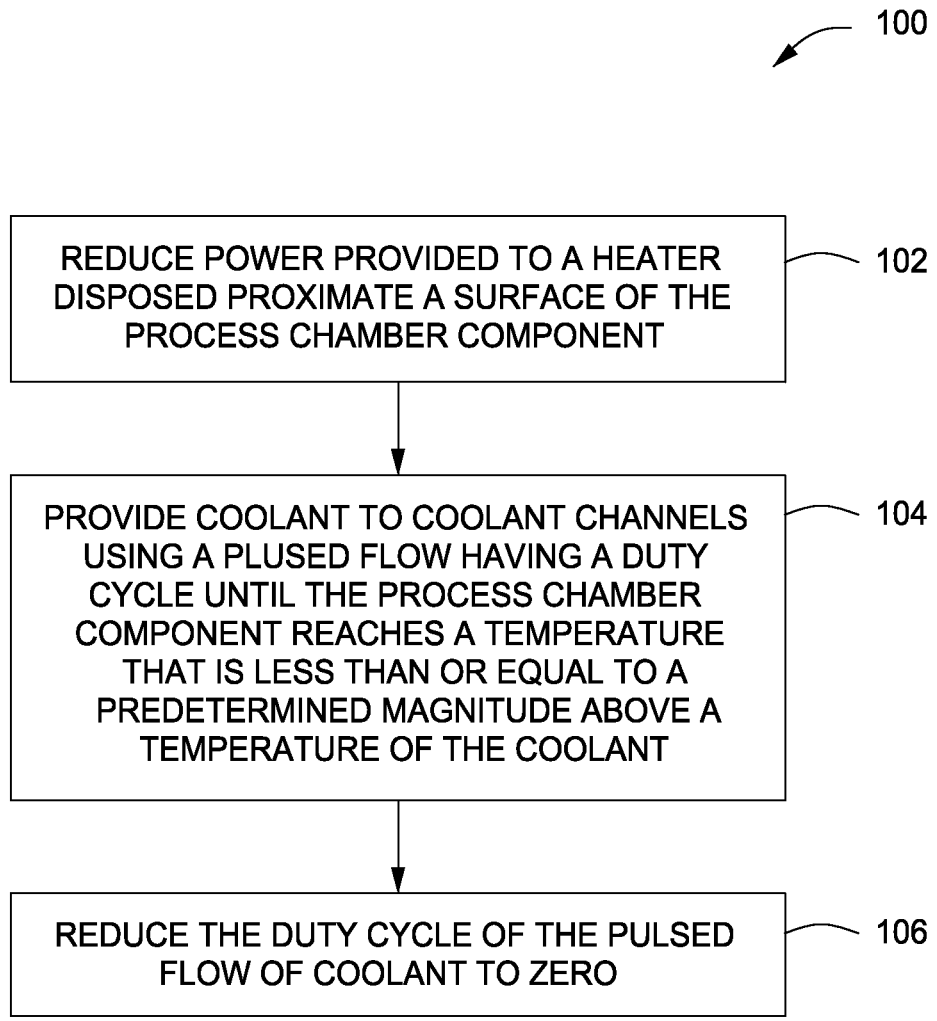
FIG. 1 depicts a method of cooling a process chamber component in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention provides methods of cooling a process chamber component. Embodiments of the inventive methods may advantageously allow chamber components to be cooled at a sufficient rate to prevent damage to the component while not requiring continuous monitoring by a user.

FIG. 1 depicts a method of cooling a process chamber component in accordance with some embodiments of the present invention. The method 100 may be performed in any process chamber utilized in any substrate process, for example, such as the process chamber 300 described below with respect to FIG. 3. In addition, the method 100 may be performed at any time where cooling of a process chamber component is needed. For example, in some embodiments, the method 100 may be performed to cool a process chamber component for maintenance, service, idle time, or the like after a process is finished in the process chamber or the process chamber is in an "offline state" (i.e. no process is being performed and/or no other heaters are being utilized).

The method 100 generally begins at 102, where power provided to a heater disposed proximate a surface of the process chamber component is reduced. By reducing the power to the heater the amount of heat provided to the process chamber component is reduced, thereby allowing the process chamber component to begin to cool.

The process chamber component may be any process chamber component that is heated during processing and is subsequently cooled, for example, such as an electrostatic chuck, a process chamber liner, a showerhead, or the like. In embodiments where the process chamber component is a showerhead, the showerhead may be similar to the showerhead 335 described below with respect to FIGS. 3 and 4.

The heater may be any type of heater used to heat a process chamber component. For example, in some embodiments, the heater may comprise one or more electrically resistive elements coupled to a power source, for example such as the heater 353 described below with respect to FIG. 3. In such embodiments, multiple electrically restive elements may be utilized to provide separate heating zones within the process chamber component. Although only one heater is described, it is to be noted that any amount of heaters may be used in the process chamber component. In embodiments where the process chamber component comprises multiple zones or multiple heaters, power to all of the multiple zones or multiple heaters may be reduced simultaneously. In such embodiments, the power may be reduced at the same rate, or in some embodiments, at a different rate for each one of the multiple zones or multiple heaters.

In some embodiments, the power provided to the heater may be reduced to zero, thereby reducing the amount of heat provided to the process chamber component to zero. In some embodiments, the power provided to the heater may be reduced incrementally in accordance with a predetermined ramp down schedule, for example as described below with respect to FIG. 2.

Next, at 104, a coolant is provided to coolant channels disposed within the process chamber component using a pulsed flow having a duty cycle. The flow of the coolant may be pulsed until the process chamber component reaches a temperature that is less than or equal to a predetermined magnitude above a temperature of the coolant. By providing the coolant at a pulsed flow, the average flow rate of the coolant may be reduced, thereby reducing the amount of heat extracted from the process chamber component, thus slowing the rate of cooling of the process chamber component. Moreover, control of the duty cycle of the pulsing facilitates control over the rate of cooling of the component. In embodiments where the process chamber component is a multi-part component, for example, such as a showerhead having a body coupled to faceplate via a bonding material (e.g. showerhead 335 described below) by slowing the rate of cooling of the process chamber component, each part of the multi-part component may maintain similar temperatures, thereby reducing stress on the bond between the parts of the component due to differences of thermal expansion of the parts, and thereby reducing the possibility of the parts of the multi-part component separating, or partially separating, during cool down.

The coolant may be any coolant suitable to extract heat from a process chamber component. For example, in some embodiments, the coolant may comprise water, ethylene glycol, methanol, propylene glycol, a fluorinert fluid (such as Galden®, available from Solvay-Solexis), a combination thereof, or the like. The coolant may be maintained at any temperature suitable to facilitate control over the temperature of the process chamber component. In some non-limiting embodiments, the coolant may be maintained at a temperature of about 0 to about 50 degrees Celsius, or in some embodiments, about 20 degrees Celsius. The coolant may be provided to the coolant channels via any type of coolant system suitable to provide the coolant to the coolant channels of the process chamber component. For example, in some embodiments, the coolant system may comprise a chiller coupled to a coolant loop having one or more valves, such as the coolant system described below with respect to FIG. 3. In such embodiments, the coolant system may provide the coolant to the coolant channels at a suitable total flow rate for the system design and operating temperatures. In some embodiments, for example, the total flow rate of the coolant may be about 1 to about 5 gallons per minute.

The coolant channels may be configured in any manner suitable to allow a flow of coolant through a particular process chamber component. For example, in some embodiments, the coolant channels may be similar to the coolant channels 408 disposed in the showerhead 335 described below with respect to FIGS. 3 and 4.

The coolant may be provided at a pulsed flow in any manner suitable, for example, such as by utilizing a valve (e.g. valves 323 described below) controlled by a pulse wave modulation controller (PWM controller 380 described below). The duty cycle may be any duty cycle suitable to provide a desired flow rate of coolant to the coolant channels to facilitate a desired rate of cooling of the process chamber component. For example, in some embodiments, the duty cycle may be up to about 100 percent, or in some embodiments, about 5 to about 50 percent, or in some embodiments, about 10 to about 12 percent. In some embodiments, for example where the coolant system may provide the coolant at a total flow rate of about 2 gallons per minute, by providing the coolant at a pulsed flow having a duty cycle of about 10 to about 12 percent, the average flow rate of the coolant provided to the coolant channels may be about 0.2 to about 0.24 gallons per minute (gpm). Of course, different systems having different configurations and/or operating at different temperatures may use other coolant temperatures, duty cycles, and/or flow rates without departing from the scope of this invention.

The coolant is provided at the pulsed flow until the process chamber component reaches a temperature that is less than or equal to the predetermined magnitude above a temperature of the coolant. The predetermined magnitude over the temperature of the coolant may be any desired magnitude that is sufficient to prevent damage to the component from any further cooling of the parts of the component. In some embodiments, the predetermined magnitude may be about 5 to about 30 degrees Celsius, or in some embodiments, about 10 degrees Celsius. In one non-limiting, illustrative example using a predetermined magnitude of 10 degrees Celsius, and where the coolant is maintained at a temperature of about 20 degrees Celsius, the coolant may be provided at the pulsed flow until the temperature of the component (such as the showerhead) is less than or equal to about 30 degrees Celsius.

The temperature of the process chamber component may be determined in any suitable manner. For example, in some embodiments, the process chamber component may be monitored by one or more temperature sensors (e.g., temperature sensors 366, 367 discussed below) disposed proximate the process chamber component and coupled to a temperature controller (e.g., temperature controller 375 discussed below).

Next, at 106, after the process chamber component reaches the temperature less than or equal to the predetermined magnitude above the temperature of the coolant, the duty cycle of the pulsed flow of the coolant is reduced to zero. By reducing the duty cycle of the pulsed flow of the coolant to zero, the flow of coolant through the coolant channels is also reduced to zero, thereby reducing the rate at which heat is extracted from the process chamber component to the coolant.

After reducing the duty cycle of the pulsed flow of the coolant to zero, the method 100 generally ends and the process chamber component may further be allowed to cool until a desired temperature is reached. In some embodiments, for example where routine service or maintenance is to be performed on the process chamber, the process chamber may be allowed to cool until the temperature of the process chamber component is cool enough to safely handle (e.g., less than about 45 degrees Celsius).

Figure 2:
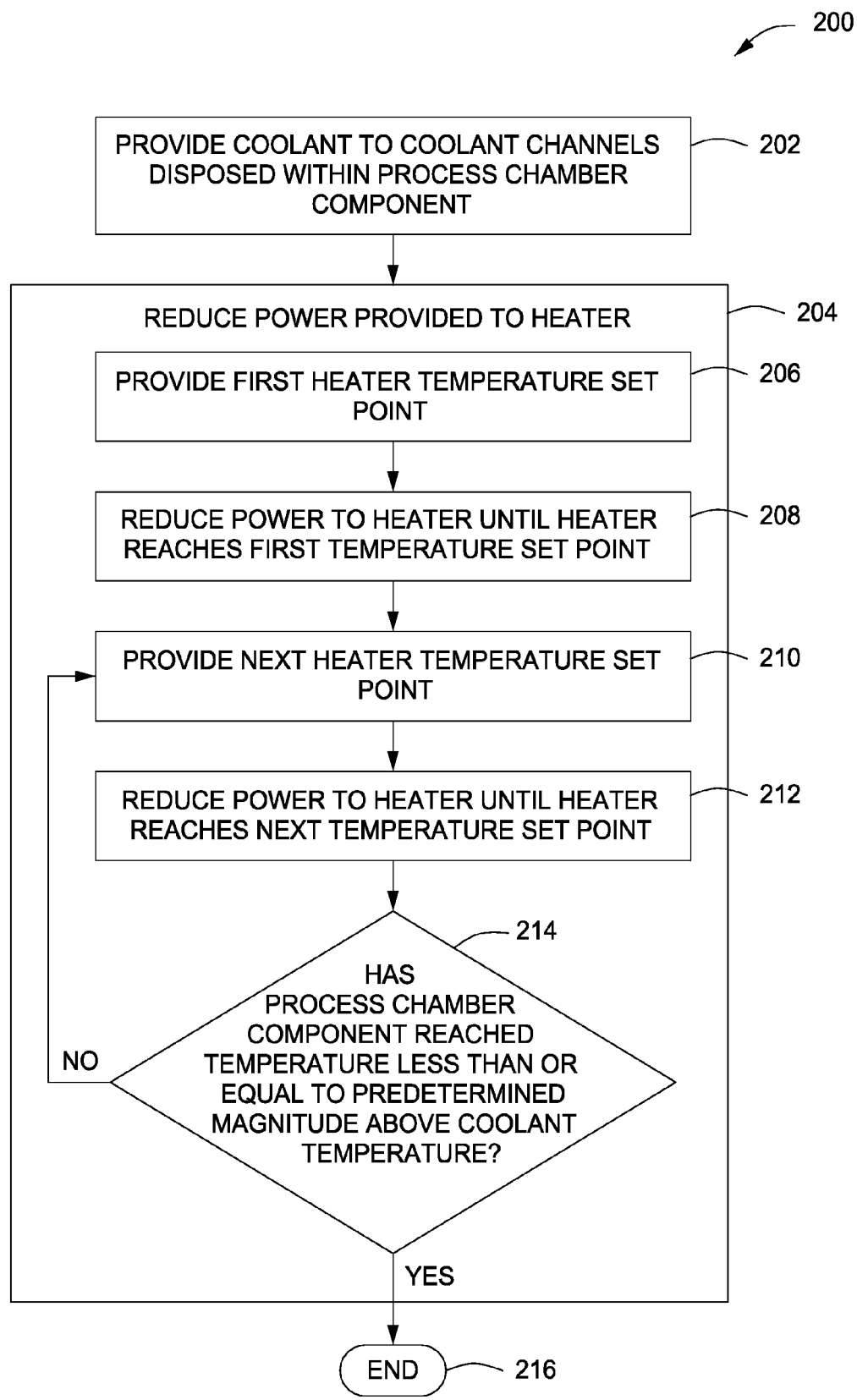
FIG. 2 depicts a method of cooling a process chamber component in accordance with some embodiments of the present invention.

FIG. 2 depicts a method of cooling a process chamber component in accordance with some embodiments of the present invention. The method 200 may be performed by itself, or in some embodiments in combination with the method 100 at 102 described above. The method 200 may be performed in any process chamber utilized in any substrate process, for example, such as the process chamber 300 described below with respect to FIG. 3. The apparatus for cooling the component may be any suitable apparatus as described herein. The method 200 may be performed at any time where cooling of a process chamber component is needed. For example, in some embodiments, the method 200 may be performed to cool a process chamber component for maintenance, service, idle time, or the like after a process is finished in the chamber.

The method 200 generally begins at 202 where a coolant is provided to the coolant channels disposed within the process chamber component. The process chamber component, coolant, coolant channels, and the like may be configured as discussed above with respect to FIG. 1.

The coolant may be provided to the coolant channels at any flow rate suitable to extract heat from a process chamber component at a desired rate. For example, in some embodiments, the coolant may be provided at a total flow rate of about 1 to about 5 gallons per minute (gpm). The flow rate of the coolant may be constant, or pulsed (for example, as discussed above). The coolant may be maintained at any temperature suitable to facilitate control over the temperature of the process chamber component, for example, such as about 0 to about 50 degrees Celsius, or in some embodiments, about 30 degrees Celsius. The actual temperature of the coolant may depend upon the component being cooled, the design/location of the coolant channels with respect to the component, and the required temperature range of operation.

Next, at 204, a power provided to a heater disposed proximate a surface of the process chamber component is reduced. By reducing the power to the heater the amount of heat provided to the process chamber component is reduced, thereby allowing the process chamber component to begin to cool. The heater may be any type of heater used to heat a process chamber component, such as described above with respect to FIG. 1.

In some embodiments, to reduce the power provided by the heater, first at 206, a first heater temperature setpoint is provided. The first heater temperature may be any temperature that is lower than the current temperature of the heater but that is elevated above room temperature (e.g., a temperature that still requires power to the heater). In some embodiments, the first heater temperature may be provided via a predetermined temperature ramp down schedule.

Next, at 208, the power provided to the heater is reduced until the heater reaches the first temperature setpoint.

Next, at 210 a next heater temperature setpoint is provided (e.g., a second heater temperature setpoint). The next heater temperature may be any temperature that is lower than the first temperature of the heater (or when iterating the method, lower than the previous temperature of the heater). In some embodiments, the next (or second) heater temperature may be provided via the predetermined temperature ramp down schedule.

Next, at 212, the power provided to the heater is reduced until the heater reaches the next (or second) temperature setpoint.

At 214, a query is made as to whether the process chamber component has reached a temperature that is less than or equal to a predetermined magnitude above a temperature of the coolant, similar as described above with respect to FIG. 1. The temperature of the process chamber component may be monitored and/or determined in any suitable manner, for example, using temperature sensors and temperature controllers as discussed below with respect to FIG. 3.

The predetermined magnitude over the temperature of the coolant may be any magnitude, for example such as about 5 to about 30 degrees Celsius, or in some embodiments, about 10. In some embodiments, if the temperature of the coolant is relatively low, for example about 0 degrees Celsius, then the magnitude may be higher, for example, about 30 degrees Celsius. In some embodiments, if the temperature of the coolant is relatively high, for example, about 40 degrees Celsius, then the magnitude may be lower, for example, from about 5 to about 10 degrees Celsius. In a non-limiting, illustrative example using a predetermined magnitude of 10 degrees Celsius, where the coolant is maintained at a temperature of about 20 degrees Celsius, the query made at 214 is answered in the negative unless the temperature of the showerhead is less than or equal to about 30 degrees Celsius.

If the process chamber component has not reached the temperature less than or equal to the predetermined magnitude above the temperature of the coolant, the method 200 returns to 210, where a next heater setpoint, lower than the previous heater setpoint, is provided and the method 200 continues as described above using progressively lower next heater temperature setpoints.

If, however, the process chamber component has reached a temperature that is less than or equal to the predetermined magnitude above the temperature of the coolant, the method 200 generally ends at 216. In some embodiments, for example, where routine service or maintenance is to be performed on the process chamber, the process chamber may then be further allowed to cool until the temperature of the process chamber component reaches about room temperature (e.g., about 18 to about 20 degrees Celsius).

Figure 3:
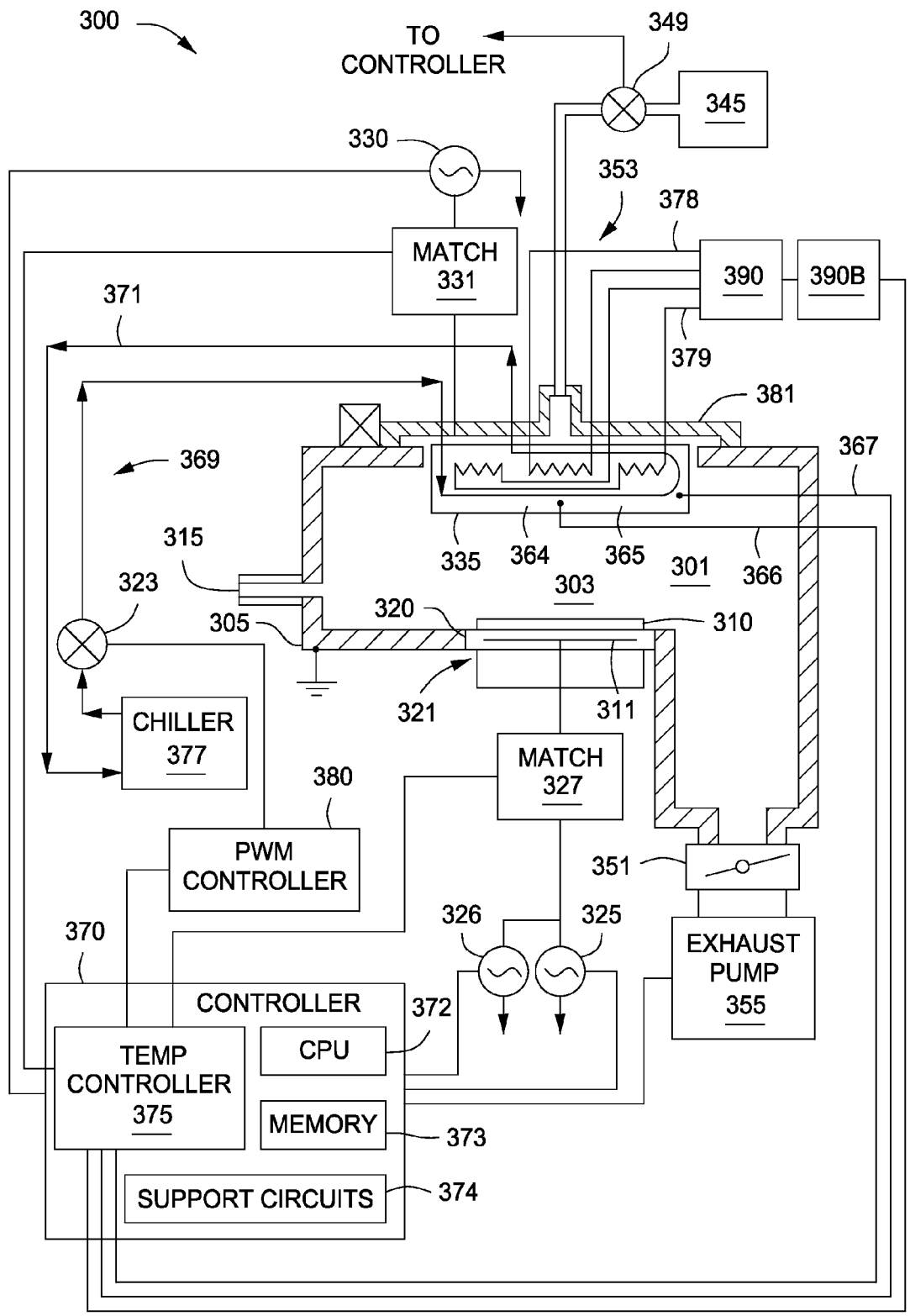
FIG. 3 depicts a process chamber suitable for use with a method of cooling a process chamber component in accordance with some embodiments of the present invention.

FIG. 3 depicts a process chamber suitable for use with the method of cooling a process chamber component described above in accordance with some embodiments of the present invention. The process chamber may be any type of chamber, for example an etch chamber, such as, but not limited to, the Enabler™, MxP®, MxP+™, Super-E™, DPS II AdvantEdge™ G3, or E-MAX™ chambers manufactured by Applied Materials, Inc., located in Santa Clara, Calif. Other process chambers, including those from other manufacturers, may similarly benefit from use of the methods as described herein.

Is some embodiments, the process chamber 300 includes a grounded chamber body 305 defining an inner volume 301 which may include a processing volume 303. In some embodiments, the processing volume 303 may be defined as an area disposed between a substrate support 321 configured to retain a substrate 310 for processing and a showerhead 335 disposed within the inner volume 301. A vacuum pump 355 may be coupled to the inner volume 301 via an exhaust valve 351 to facilitate evacuating the inner volume 301.

In some embodiments, the substrate 310 may be loaded through an opening 315 in the chamber body 305 via a substrate transfer robot (not shown) and provided to the substrate support 321. In some embodiments, the substrate support may include one or more mechanisms to retain the substrate 310 atop the substrate support 321, for example such as an electrostatic chuck 310. The substrate 310 may be any type of substrate conventionally employed in the plasma processing art and the inventive methods disclosed herein are not limited in this respect.

In some embodiments, the process chamber 300 may comprise a plasma power source (e.g. RF source 330) coupled to an upper electrode (e.g. a conductive portion of the chamber ceiling 381, the showerhead 335, or the like) via a match network 331 to inductively or capacitively provide power to form a plasma in the processing volume 301 of the process chamber 300.

A plasma source power 330 is coupled through a match 331 to a plasma generating element to provide high frequency source power to inductively or capacitively energize the plasma. In some embodiments, one or more bias power sources (two RF power sources 325, 326) may be coupled to an electrode 311 disposed in the substrate support 320 (e.g., cathode) via a match network 327 to energize the plasma. In such embodiments, each of the one or more bias power sources may provide power at a frequency of about 2 MHz to 60 MHz, or in some embodiments, about 13.56 MHz. In some embodiments, each of the one or more bias power sources may provide the power at the same, or in some embodiments, a different frequency.

In some embodiments, the process chamber 300 may include a showerhead 335 (described below with respect to FIG. 4) configured to provide one or more process gases supplied from a gas supply 345 via a mass flow controller 349 to the inner volume 301. In some embodiments, the showerhead 335 may be a temperature controlled showerhead having one or more heating zones (center or inner heating zone 364 and edge or outer heating zone 365 shown) wherein each zone is independently controllable. Although shown having two zones, the showerhead 335 may have any amount of zones, for example such as one zone, or three or more zones.

In some embodiments, each of the one or more heating zones may comprise a heater 353 having one or more electrically resistive heating elements 378, 379 coupled to a heater element 390. The heater element 390 may be coupled to a heater driver 390B and controlled by a temperature controller 375. The heating elements 378, 379 may be independently driven based on one or more temperature sensors 366 and 367 (e.g., an optical probe in each of the heating zones 364, 365). The heater driver 390B may be a solid state relay or a semiconductor controlled rectifier (SCR), for example. In some embodiments, the heater controller 391 provides pulse wave modulation (PWM) functionality analogous to, or in place of, a coolant liquid PWM controller 380 to interface the temperature controller 375 with either or both of the heating elements 378, 379 and a coolant loop 371 (described below).

Alternative to, or in combination with, the one or more heating zones, in some embodiments, the process chamber 300 may comprise a coolant system 369 having one or more coolant loops 371 to facilitate control over the temperature of the showerhead 335. In some embodiments, the coolant system 369 comprises a chiller 377 to provide a cooling power to the showerhead 335 via the coolant loop 371 thermally coupling the showerhead 335 with the chiller 377. In operation, a coolant (e.g., 50% ethylene glycol) is passed through one or more coolant channels (described below) embedded in both the inner heating zone 364 and outer heating zone 365 (e.g., entering proximate to a first zone and exiting proximate to the other zone) of the showerhead 335. The flow rate of the coolant through the one or more coolant loops 371 and one or more coolant channels is controlled by a pulse wave modulation controller 380 via one or more valves (one valve 323 shown).

In some embodiments, the temperature controller 375 is coupled to a coolant PWM controller 380. The PWM controller 380 may be of any type commonly available and configurable to operate the valve(s) 323 for embodiments where those valves are digital (i.e., having binary states; either fully open or fully closed) at a duty cycle dependent on control signals sent by the temperature controller 375. For example, the PWM signal can be produced by a digital output port of a computer (e.g., controller 370) and that signal can be used to drive a relay that controls the valves to on/off positions.

In some embodiments, to reduce the cooling power during system idle time (e.g., when no plasma processing is occurring in the chamber 305) the temperature controller 375 may maintain control over the cooling loop 101 during both an idle state (e.g., no substrate processing being performed by chamber) and an active state (e.g., substrate processing being performed).

To facilitate control of the process chamber 300, a controller 370 may be coupled to the process chamber. The controller 370 may be one of any form of general-purpose computer processor that can be used in an industrial setting for controlling various chambers and sub-processors. The memory, or computer-readable medium 373 of the CPU 372 may be one or more of readily available memory such as random access memory (RAM), read only memory (ROM), floppy disk, hard disk, or any other form of digital storage, local or remote. The support circuits 374 are coupled to the CPU 372 for supporting the processor in a conventional manner. These circuits include cache, power supplies, clock circuits, input/output circuitry and subsystems, and the like.

The inventive methods disclosed herein may generally be stored in the memory, or computer-readable medium 373 as a software routine that, when executed by the CPU 372, causes the process chamber 300 to perform processes of the present invention. The software routine may also be stored and/or executed by a second CPU (not shown) that is remotely located from the hardware being controlled by the CPU 372. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 372, transforms the general purpose computer into a specific purpose computer (controller) 370 that controls the chamber operation such that the methods disclosed herein are performed.

In some embodiments, the temperature controller 375, as the integrated temperature control software plane of the system controller 370, is to execute at least a portion of the methods described herein. As such, the temperature controller 375 may be either software or hardware or a combination of both software and hardware. The temperature controller 375 is to output control signals affecting the rate of heat transfer between the showerhead 335 and a heat source and/or heat sink external to the plasma chamber 305. In some embodiments, the temperature controller 375 is coupled, either directly or indirectly, to the chiller 377 and the heater element 390. A difference between the temperature of the chiller 377 and the setpoint temperature 106 may be input into the feedforward control line along with the plasma power.

Alternatively, in some embodiments, the temperature controller 375 need not be contained within, or provided by, the integrated process chamber control software plane of the system controller 370. In such embodiments, the functionality of temperature controller 375 may be instead provided as discrete system. For example, PID controllers, may be designed to include additional feedforward inputs, such as the plasma power. The discrete system may further be manufactured to include a processor having the ability to determine a feedforward control effort based on those feedforward inputs. As such, all the embodiments described herein for temperature control may be provided either by the temperature controller 375 as a facet of an integrated process chamber control software plane or as a component of the PWM controller 380 and/or heater driver 390B.

Figure 4:
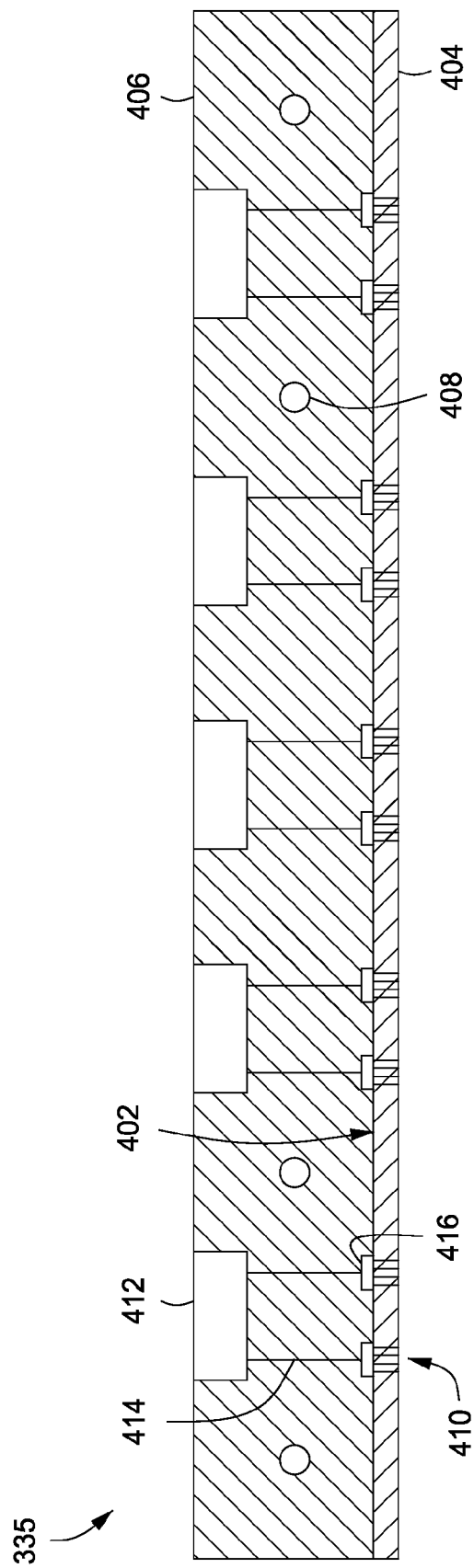
FIG. 4 depicts a showerhead suitable for use with the process chamber of FIG. 3 in accordance with some embodiments of the present invention.

Referring to FIG. 4, in some embodiments, the showerhead may generally comprise a faceplate 404 coupled to a body 406. The body 406 maybe fabricated from any suitable material, for example, a metal such as aluminum, or the like. In some embodiments, the body 406 may comprise a plurality of coolant channels 408 configured to allow flow of a coolant from a coolant source (e.g., coolant loop 371 described above) to facilitate control over the temperature of the showerhead 335.

In some embodiments, the body 406 may comprise a first set of plenums 412 fluidly coupled to a second set of plenums 416 via one or more conduits 414. A gas source (e.g., gas source 345 described above) may be coupled to the first set of plenums 412 to provide one or more process gases to the first set of plenums 412. In operation, the one or more process gases supplied by the gas source flows from the first set of plenums 412 to the second set of plenums 416 via the one or more conduits 414.

In some embodiments, the faceplate 404 may be fabricated from any suitable material, for example, such as silicon carbide (SiC), yttria, or the like. The faceplate 404 may be coupled to the body via any suitable means, for example such as via a bonding material disposed at an interface 402 between the faceplate 404 and the body 406. The bonding material may be any material suitable to facilitate a secure bonding of the under process conditions, for example, such as a silicone-based bonding material, or the like.

In some embodiments, the faceplate 404 may comprise a plurality of sets of through holes 410, wherein each set of through holes 410 is fluidly coupled to one or more of the second set of plenums 416 of the body 406. In operation, the one or more gases supplied by the gas source flows from the second set of plenums 416 of the body 406 to the through holes 410 of the faceplate 404 and is distributed to an inner volume of a process chamber (e.g., inner volume 301 of process chamber 300 described above).

Thus, methods cooling process chamber components have been provided herein. The inventive methods may advantageously allow chamber components to be cooled at a sufficient rate to prevent damage while not requiring continuous monitoring by a user.

While the foregoing is directed to embodiments of the present invention, other and further embodiments of the invention may be devised without departing from the basic scope thereof.

The invention claimed is:

1. A method of cooling a process chamber component, comprising:
reducing a power provided to a heater disposed proximate a surface of the process chamber component to reduce an amount of heat provided to the component by the heater;
providing a coolant to coolant channels disposed within the process chamber component using a pulsed flow having a duty cycle until the process chamber component reaches a temperature that is less than or equal to a predetermined magnitude above a temperature of the coolant; and
after the process chamber component reaches the temperature less than or equal to the predetermined magnitude above a temperature of the coolant, reducing the duty cycle of the pulsed flow of the coolant to zero,
wherein reducing the power provided to the heater comprises:
(a) providing a first heater temperature setpoint in accordance with a predetermined temperature rampdown schedule;
(b) reducing the power provided to the heater until the heater reaches the first heater temperature setpoint;
(c) providing a second heater temperature setpoint in accordance with a predetermined temperature rampdown schedule;
(d) reducing the power provided to the heater until the heater reaches the second heater temperature setpoint; and
(e) repeating (c)-(d) using sequentially lower heater temperature setpoints if the process chamber component has not reached a temperature that is less than or equal to the predetermined magnitude above the temperature of the coolant.

2. The method of claim 1, wherein the amount of heat provided by the heater is reduced to zero.

3. The method of claim 1, wherein the process chamber component is a showerhead.

4. The method of claim 3, wherein the showerhead comprises:
a body having the one or more coolant channels disposed within the body, wherein the body comprises a material having a first coefficient of thermal expansion; and
a faceplate coupled to the body via a bonding material, wherein the faceplate comprises a material having a second coefficient of thermal expansion, different from the first coefficient of thermal expansion.

5. The method of claim 4, wherein the body comprises aluminum.

6. The method of claim 5, wherein the faceplate comprises silicon carbide (SiC) or yttria.

7. The method of claim 1, wherein the duty cycle of coolant is about 5 to about 50 percent.

8. The method of claim 1, wherein the duty cycle of coolant is about 10 to about 12 percent.

9. The method of claim 1, wherein the coolant is provided at a total flow rate of about 1 to 5 gallons per minute.

10. The method of claim 1, wherein the predetermined magnitude is about 5 to about 30 degrees Celsius.

11. A method of cooling a process chamber component having coolant channels and a heater disposed within the process chamber component, comprising:

flowing a coolant through the coolant channels to remove heat from the process chamber component; and reducing a power provided to the heater to reduce an amount of heat provided to the process chamber component by the heater by:

(a) providing a first heater temperature setpoint in accordance with a predetermined temperature rampdown schedule;

(b) reducing a power provided to the heater until the heater reaches the first heater temperature setpoint;

(c) providing a second heater temperature setpoint in accordance with a predetermined temperature rampdown schedule;

(d) reducing the power provided to the heater until the heater reaches the second heater temperature setpoint; and (e) repeating (c)-(d) using sequentially lower heater temperature setpoints until the process chamber component reaches a temperature that is less than or equal to a predetermined magnitude above a temperature of the coolant.

12. The method of claim 11, wherein the process chamber component is a showerhead.

13. The method of claim 12, wherein the showerhead comprises:

a body having the coolant channels disposed within the body, wherein the body comprises a material having a first coefficient of thermal expansion; and a faceplate coupled to the body via a bonding material, wherein the faceplate comprises a material having a second coefficient of thermal expansion, different from the first coefficient of thermal expansion.

14. A non-transitory computer readable medium having instructions stored thereon that, when executed, cause a method of cooling a process chamber component to be performed, the method comprising:

reducing a power provided to a heater disposed proximate a surface of the process chamber component to reduce an amount of heat provided to the component by the heater;

providing a coolant to coolant channels disposed within the process chamber component using a pulsed flow having a duty cycle until the process chamber component reaches a temperature that is less than or equal to a predetermined magnitude above a temperature of the coolant; and after the process chamber component reaches the temperature less than or equal to the predetermined magnitude above a temperature of the coolant, reducing the duty cycle of the pulsed flow of the coolant to zero, wherein reducing the power provided to the heater comprises:

(a) providing a first heater temperature setpoint in accordance with a predetermined temperature rampdown schedule;

(b) reducing the power provided to the heater until the heater reaches the first heater temperature setpoint;

(c) providing a second heater temperature setpoint in accordance with a predetermined temperature rampdown schedule;

(d) reducing the power provided to the heater until the heater reaches the second heater temperature setpoint; and (e) repeating (c)-(d) using sequentially lower heater temperature setpoints if the process chamber component has not reached a temperature that is less than or equal to the predetermined magnitude above the temperature of the coolant.

15. The non-transitory computer readable medium of claim 14, wherein the amount of heat provided by the heater is reduced to zero.

16. The non-transitory computer readable medium of claim 14, wherein the duty cycle is about 5 to about 50 percent.

17. The non-transitory computer readable medium of claim 14, wherein the coolant is provided using the pulsed flow at a flow rate of about 1 to 5 gallons per minute.

18. The non-transitory computer readable medium of claim 14, wherein the predetermined magnitude is about 5 to about 30 degrees Celsius.

* * * * *